US006894923B2

(12) United States Patent
Inaba

(10) Patent No.: US 6,894,923 B2
(45) Date of Patent: May 17, 2005

(54) MAGNETIC MEMORY DEVICE

(75) Inventor: Tsuneo Inaba, Kamakura (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/650,671

(22) Filed: Aug. 29, 2003

(65) Prior Publication Data
US 2004/0233711 A1 Nov. 25, 2004

(30) Foreign Application Priority Data
May 21, 2003 (JP) ........................................ 2003-143318

(51) Int. Cl.[7] ............................................. G11C 11/00
(52) U.S. Cl. ................................. 365/158; 365/230.06
(58) Field of Search ........................ 365/158 O, 230.06

(56) References Cited

U.S. PATENT DOCUMENTS

| 5,701,276 A | * | 12/1997 | Bellini ........................ 367/133 |
| 2004/0037112 A1 | * | 2/2004 | Ooishi ..................... 365/185.09 |
| 2004/0042292 A1 | * | 3/2004 | Sakata et al. ................ 365/202 |
| 2004/0047179 A1 | * | 3/2004 | Tanizaki et al. ............. 365/171 |

OTHER PUBLICATIONS

Roy Scheuerlein, et al., "A 10ns Read and Write Non–Volatile Memory Array Using a Magnetic Tunnel Junction and FET Switch in each Cell" IEEE International Solid State Circuits Conference(ISSCC) Digest of Technical Papers, pp. 128–129, Feb. 8, 2000.

M. Durlam, et al., "Nonvolatile RAM based on Magnetic Tunnel Junction Elements", IEEE International Solid–State Circuits Conference, (ISSCC) Digest of Technical Papers, pp. 130–131, Feb. 8, 2000.

Peter K. Naji, et al., "A 256kb 3.0V 1T1MTJ Nonvolatile Magnetoresistive RAM", IEEE International Solid–State Circuits Conference (ISSCC) Digest of Technical Papers, pp. 122–123, Feb. 6, 2001.

* cited by examiner

Primary Examiner—Van Thu Nguyen
(74) Attorney, Agent, or Firm—Oblon, Spivak, McClelland, Maier & Neustadt, P.C.

(57) ABSTRACT

A magnetic memory device includes first to n-th MTJ devices recording data and first to n-th transistors connected to the first to n-th MTJ devices, respectively. The word line generates a magnetic field to be applied to the first to n-th MTJ devices during a write operation. A read word line is connected to gates of the first to n-th transistors and applies a voltage for turning on the first to n-th transistors during a read operation. A first word line driver is connected to a first end or a second end of the write word line and drives the write word line. A second word line driver is connected to a first end of the read word line and drives the read word line. A second switching circuit selectively connects the second end of the read word line and the second end of the write word line.

23 Claims, 13 Drawing Sheets

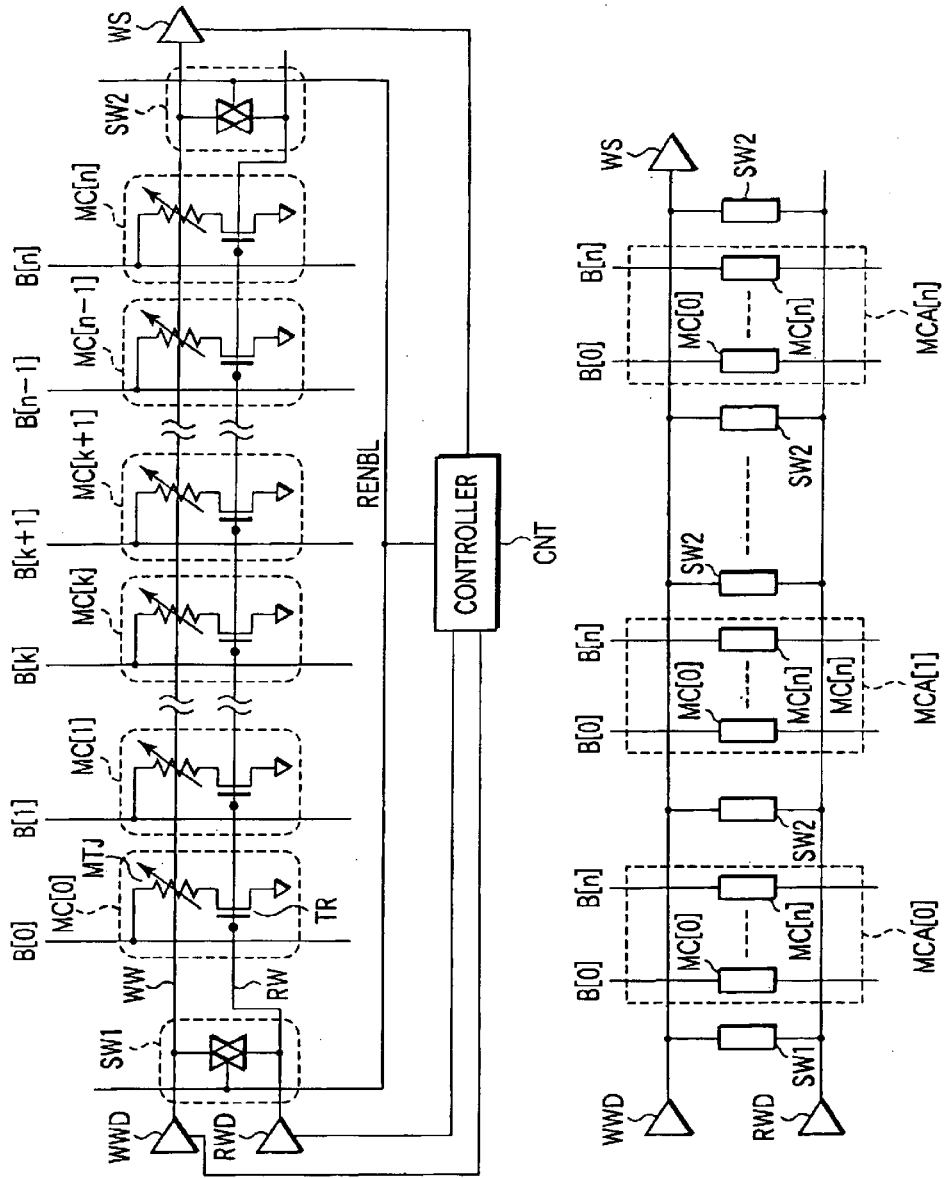
F I G. 1
F I G. 2

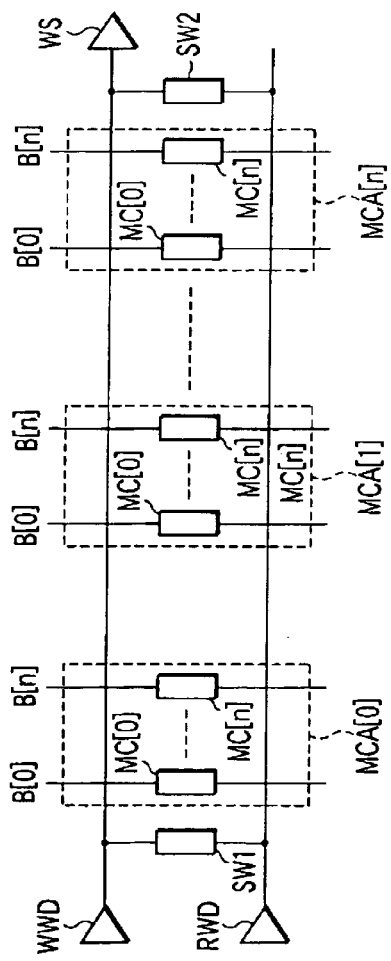
F I G. 3
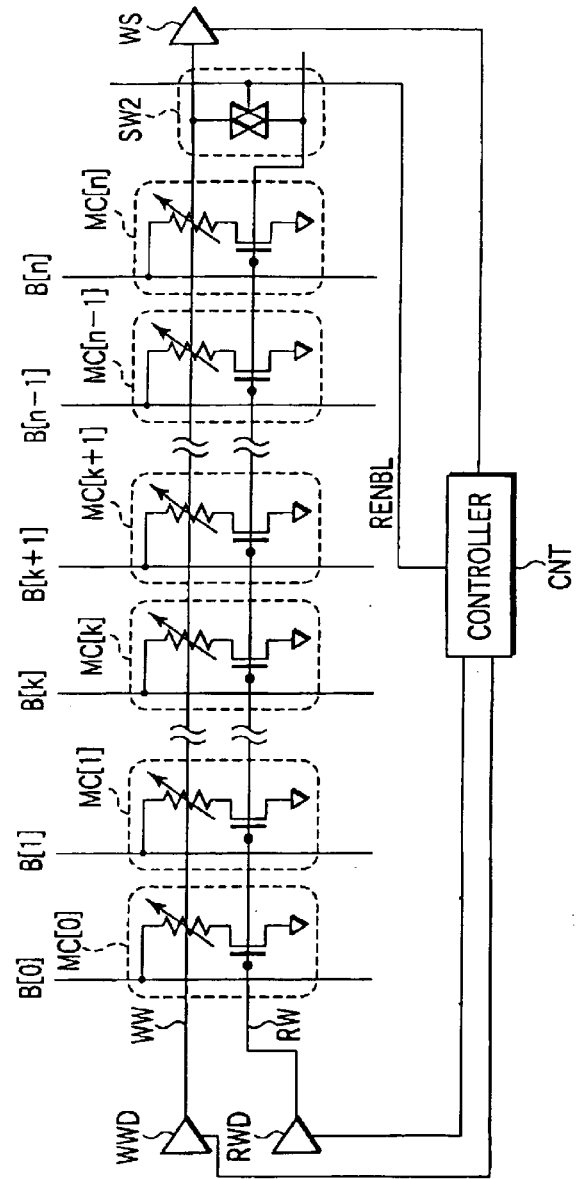
F I G. 4

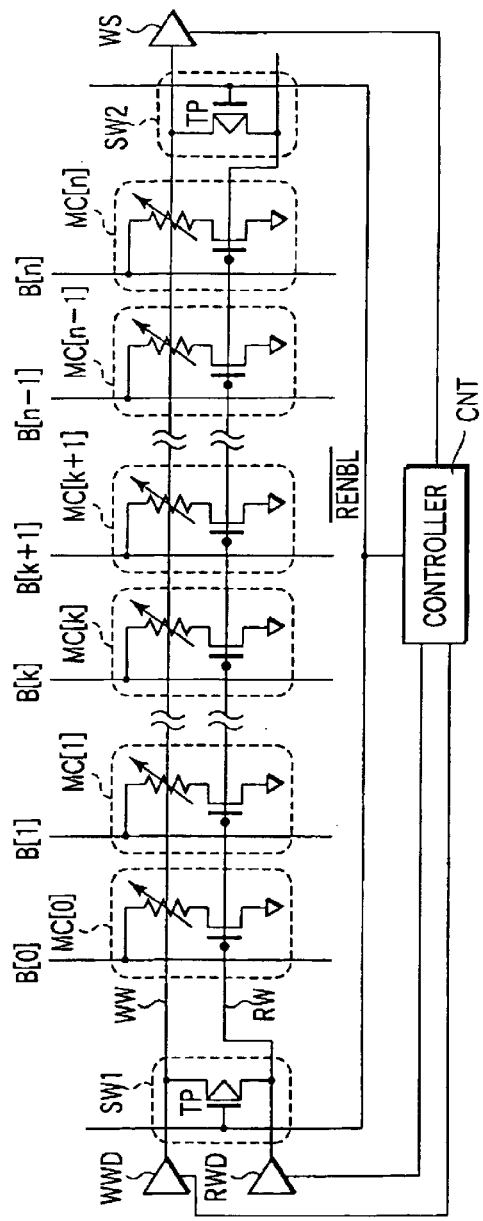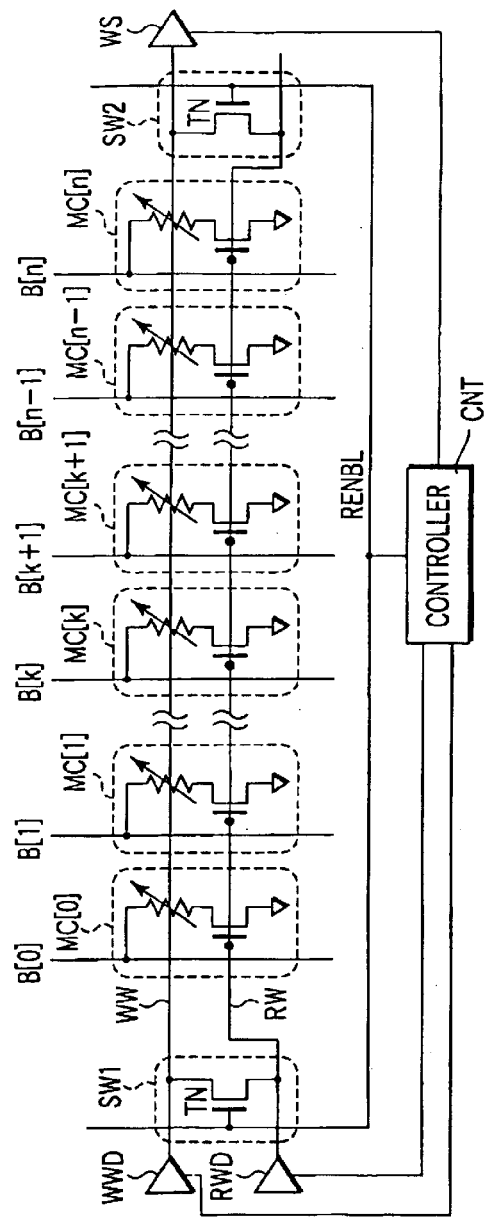
F I G. 5
F I G. 6

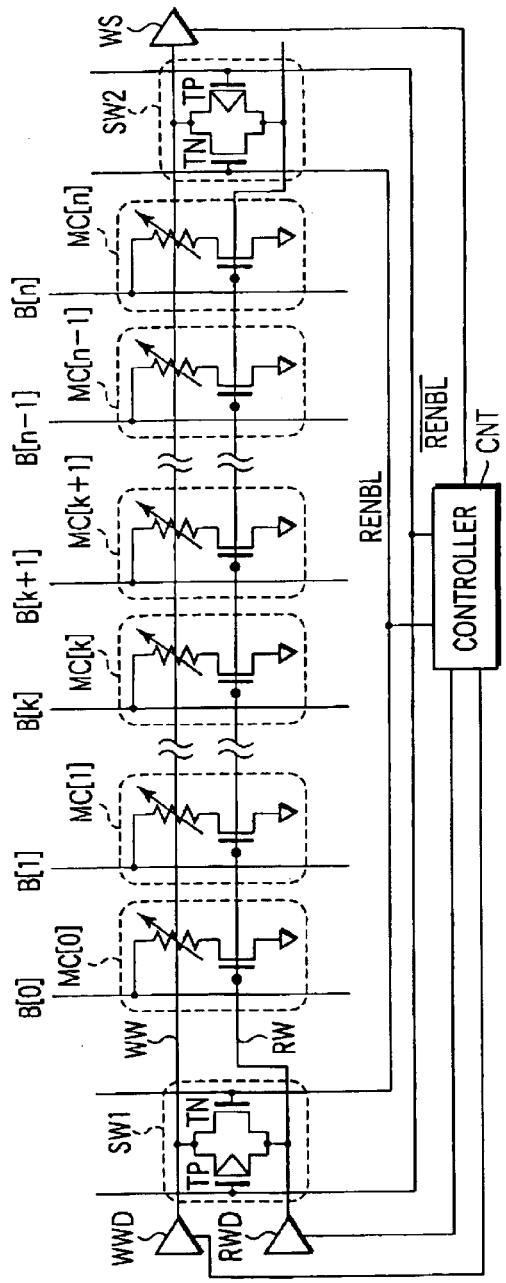
F I G. 7
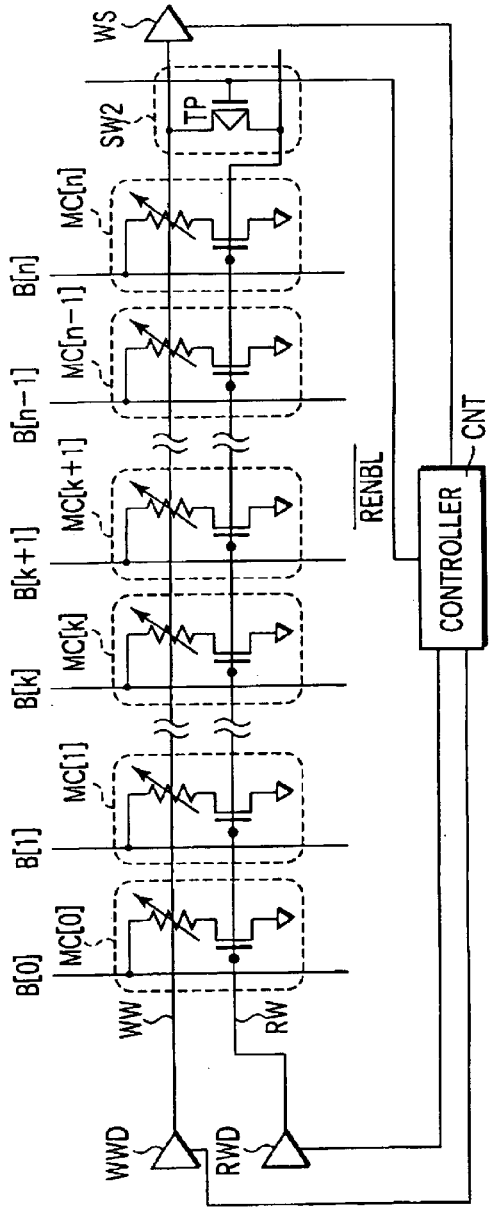
F I G. 8

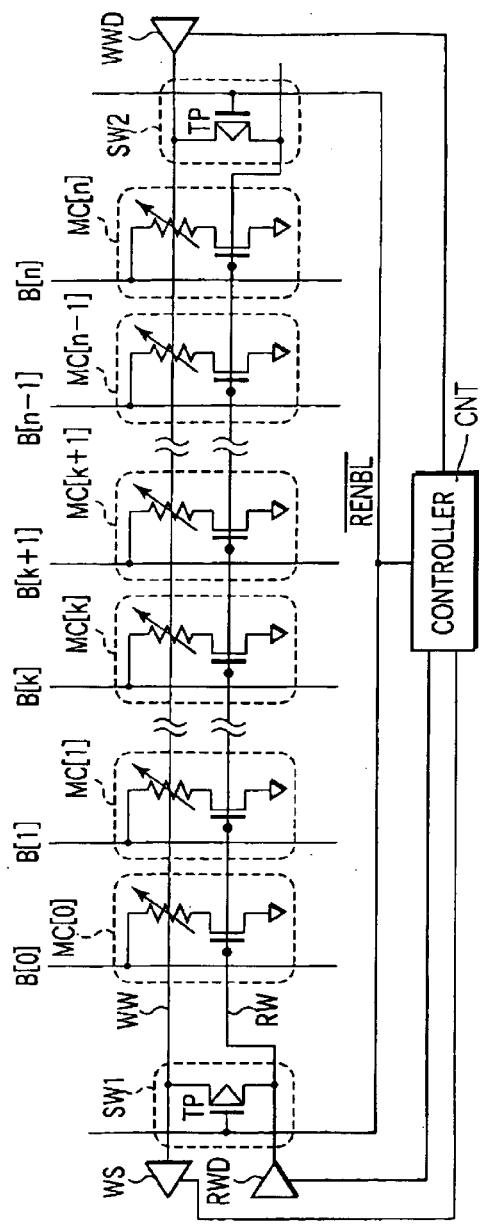
F I G. 13
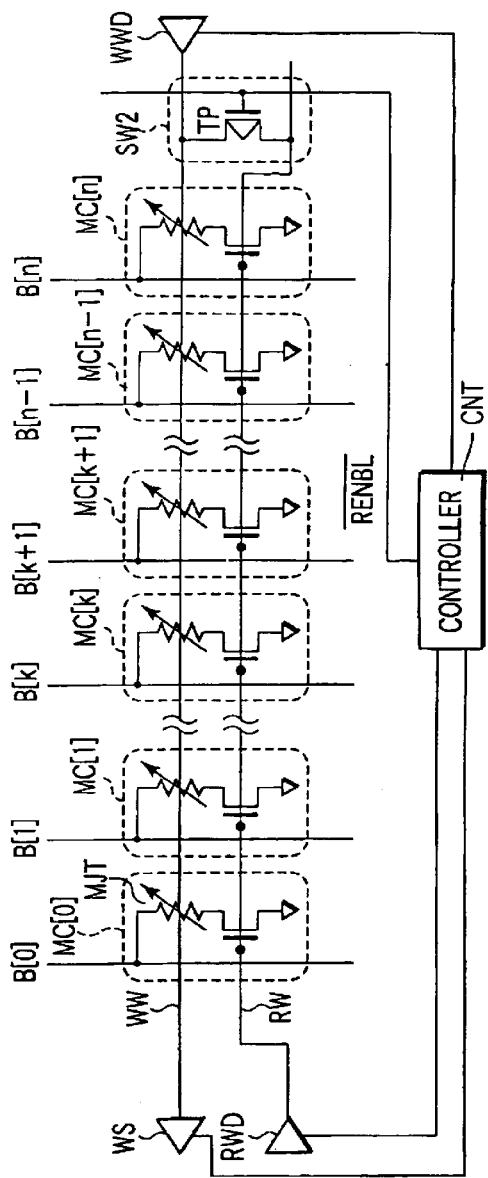
F I G. 14

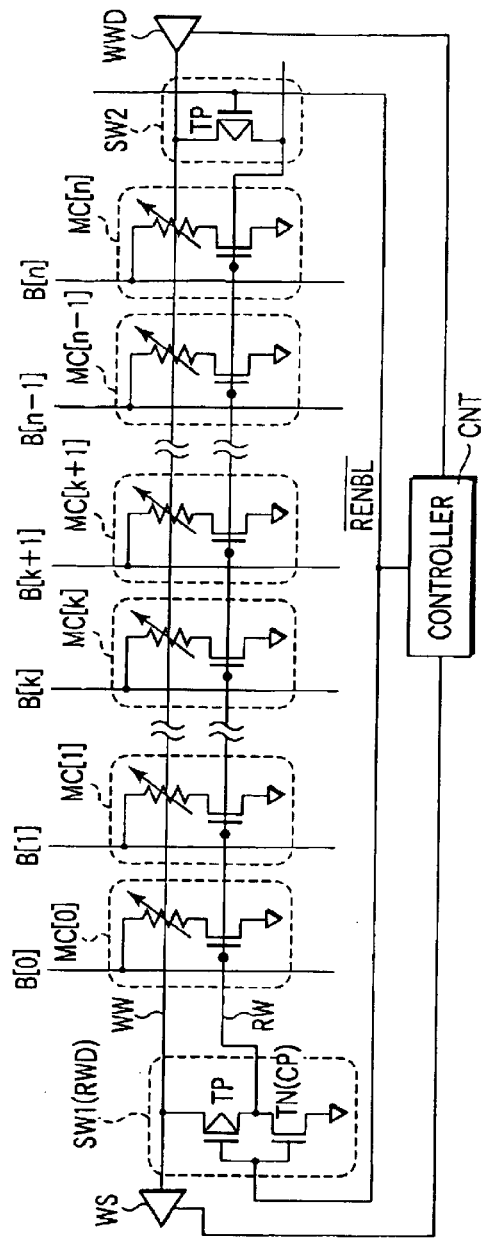
F I G. 15
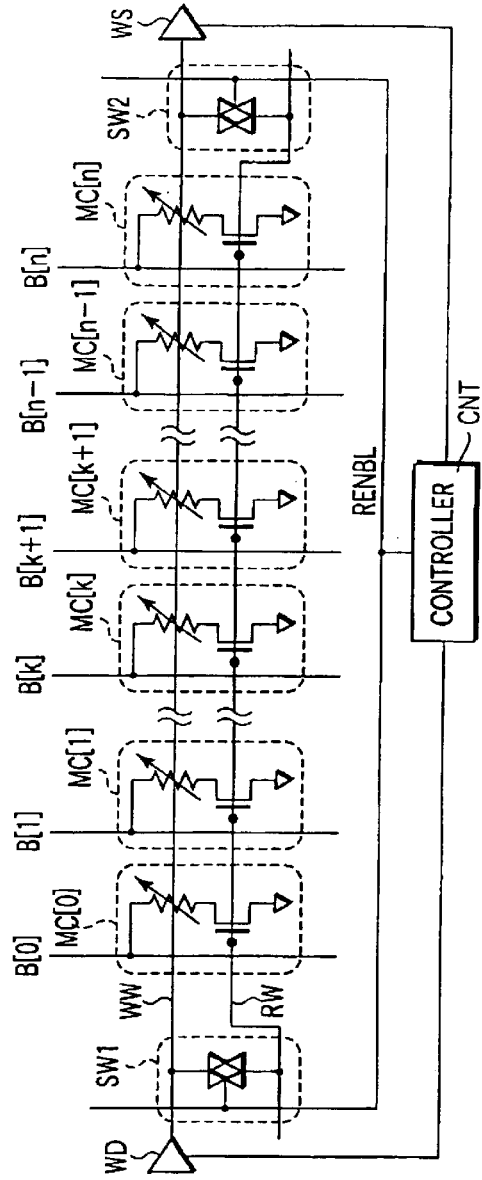
F I G. 16

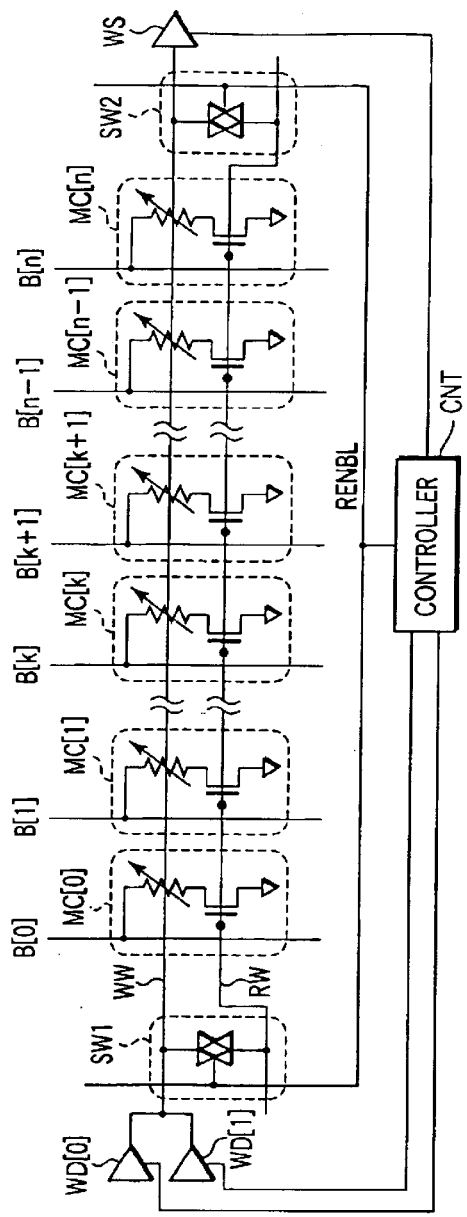
F I G. 17
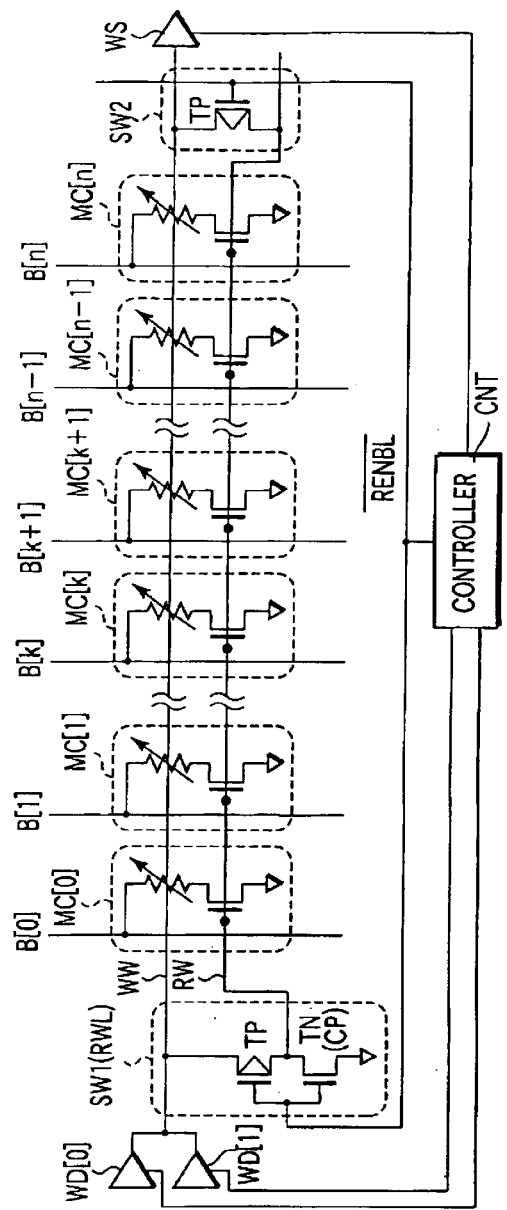
F I G. 18

MAGNETIC MEMORY DEVICE

CROSS-REFERENCE TO RELATED APPLICATIONS

This application is based upon and claims the benefit of priority from prior Japanese Patent Application No. 2003-143318 filed May 21, 2003, the entire contents of which are incorporated herein by reference.

BACKGROUND OF THE INVENTION

1. Field of the Invention

The present invention relates to a magnetic memory device, and more particularly, to a magnetic memory device having write word lines, which indicate word lines to be used during a write operation, and read word lines, which indicate word lines to be used during a read operation.

2. Description of the Related Art

As a magnetic memory device, a magnetic random access memory (MRAM) is known. In a memory cell of an MRAM, a device having a magnetic tunnel junction (MTJ) is used. An MTJ device is formed of two ferromagnetic films (one serving as a pinned layer (fixed layer); the other as a recording layer (free layer)) and a single dielectric film (serving as a tunnel barrier layer) sandwiched between the two ferromagnetic films.

FIG. 21 is a cross sectional view of a typical memory cell (MC) of an MRAM. To write data, current is passed through a write word line (Write Word Line) WW and crossing a bit line B at right angles, thereby producing a magnetic field at the intersection between the bit line B and the write word line WW. This magnetic field reverses the direction of magnetization of the recording layer of the MTJ device MTJ. Depending on the relative orientation (either parallel or nonparallel) of the magnetization of the recording layer with respect to the pinned layer, binary 0 or binary 1 is written.

The data is read by using the tunneling magnetoresistive (TMR) effect, a phenomenon in which the electric resistance of the MTJ device MTJ changes with the relative angle between the direction of magnetization of the ferromagnetic film forming the MTJ device MTJ and the current direction. Specifically, first the read word line (Read-Word-Line) RW is driven to turn on a memory cell transistor TR, so that current flows from the bit line B to a ground GND via the MTJ device MTJ, and then the signal current is detected by a sense amplifier (not shown) connected to the bit line B, the resistance mentioned above can be detected.

FIG. 22 is a circuit diagram of the memory cell shown in FIG. 21. FIG. 23 is a conventional circuit diagram showing a memory cell array including memory cells of the type shown in FIG. 22 and the peripheral portion. As shown in FIG. 23, memory cells MC[0,0] to MC[m, n] are arranged at the intersections of a set of write word lines WW[0] to WW[m] and read word lines RW[0] to RW[m], and bit lines B[0] to [n]. Bit line drivers BDU[0] to BDU[n], which are positioned above the memory cell array MCA, and bit line drivers BDL[0] to BDL[n], which are positioned below the memory cell array MCA, drive bit lines B[0] to B[n], respectively. The two ends of each of corresponding write word lines WW[0] to WW[n] are connected to the corresponding write word line drivers WWD[0] to WWD[n] and current sinkers WS[0] to WS[n], respectively. During a write operation, a write current flows by activating one of the pairs of the write word line driver WWD[i] and the current sing circuit WS[i], where i=0, 1, . . . , n.

A large current is supplied to the write word lines WW (WW[0] to [m]) to generate magnetic fields in the memory cells MC (MC[0,0] to MC[m, n]). Therefore, the write word lines are generally formed of a low-resistance metal. On the other hand, it is not necessary to supply such a large current to the read word lines RW (RW[0] to RW[m]). For this reason, the read word lines RW are formed of a relatively high-resistance material (e.g., polysilicon), which is usually used in the gate electrode of a memory cell transistor TR.

As described above, a read word line RW has a resistance about 10 to 100 times larger than that of a write word line WW. In addition, since the read word line RW is the gate electrode of a memory cell transistor TR, it has a large capacitance. As a result, the product of resistance and capacitance (RC) of the read word line RW becomes large, which degrades an operation speed. The problem of read-speed reduction becomes severe in a large-scale memory cell array (MCA). To avoid this problem, the memory cell array MCA must be limited in size.

To overcome the above problems, a second conventional circuit design is proposed in FIG. 24 in which a single read word line RW and a single write word line WW are shown. As shown in FIG. 24, a word line control circuit WCTR is connected to both ends of the write word line WW. The write word line WW and the read word line RW are connected by a shunt ST. One end of a memory cell transistor TR is connected to the common node CN, which is grounded via a connection transistor S. Since the read word line RW is connected to the write word line WW, the effective resistance value of the read word line RW becomes lower than that in the first conventional circuit. To prevent the transistor TR from being turned on by the current flowing through the read word line RW during the write operation, the common node CN is isolated from the ground by the connection transistor S.

However, in the second conventional circuit design, since the read word line RW and the write word line WW are connected via the shunt ST, the following problems may occur. First, since the shunt ST takes up space, the area occupied by the memory cell array MCA increases. Second, the periodical layout pattern of the memory cell array MCA breaks by the presence of the shunt ST. This collapse of the periodicity makes submicron lithography more difficult.

BRIEF SUMMARY OF THE INVENTION

According to a first aspect of the present invention, there is provided a magnetic memory device comprising: first to n-th MTJ devices recording data; first to n-th transistors connected to the first to n-th MTJ devices, respectively; a write word line which generates a magnetic field to be applied to the first to n-th MTJ devices during a write operation; a read word line which is connected to a gate of each of the first to n-th transistors and which applies a voltage for turning on the first to n-th transistors during a read operation; a first word line driver which is connected to a first end or a second end of the write word line and which drives the write word line; a second word line driver which is connected to a first end of the read word line and which drives the read word line; and a second switching circuit which selectively connects a second end of the read word line and the second end of the write word line.

BRIEF DESCRIPTION OF THE SEVERAL VIEWS OF THE DRAWING

FIG. 1 is a schematic diagram of a magnetic memory device according to a first embodiment of the present invention;

FIG. 2 is a schematic diagram of a magnetic memory device according to a modified example of the first embodiment of the present invention;

FIG. 3 is a schematic diagram of a magnetic memory device according to another modified example of the first embodiment of the present invention;

FIG. 4 is a schematic diagram of a magnetic memory device according to a second embodiment of the present invention;

FIG. 5 is a schematic diagram of a magnetic memory device according to a third embodiment of the present invention;

FIG. 6 is a schematic diagram of a magnetic memory device according to another example of the third embodiment of the present invention;

FIG. 7 is a schematic diagram of a magnetic memory device according to still another example of the third embodiment of the present invention;

FIG. 8 is a schematic diagram of a magnetic memory device according to a fourth embodiment of the present invention;

FIG. 13 is a schematic diagram of a magnetic memory device according to a ninth embodiment of the present invention;

FIG. 14 is a schematic diagram of a magnetic memory device according to a tenth embodiment of the present invention;

FIG. 15 is a schematic diagram of a magnetic memory device according to an eleventh embodiment of the present invention;

FIG. 16 is a schematic diagram of a magnetic memory device according to a twelfth embodiment of the present invention;

FIG. 17 is a schematic diagram of a magnetic memory device according to a thirteenth embodiment of the present invention;

FIG. 18 is a schematic diagram of a magnetic memory device according to a fourteenth embodiment of the present invention;

DETAILED DESCRIPTION OF THE INVENTION

Figures 9, 10:
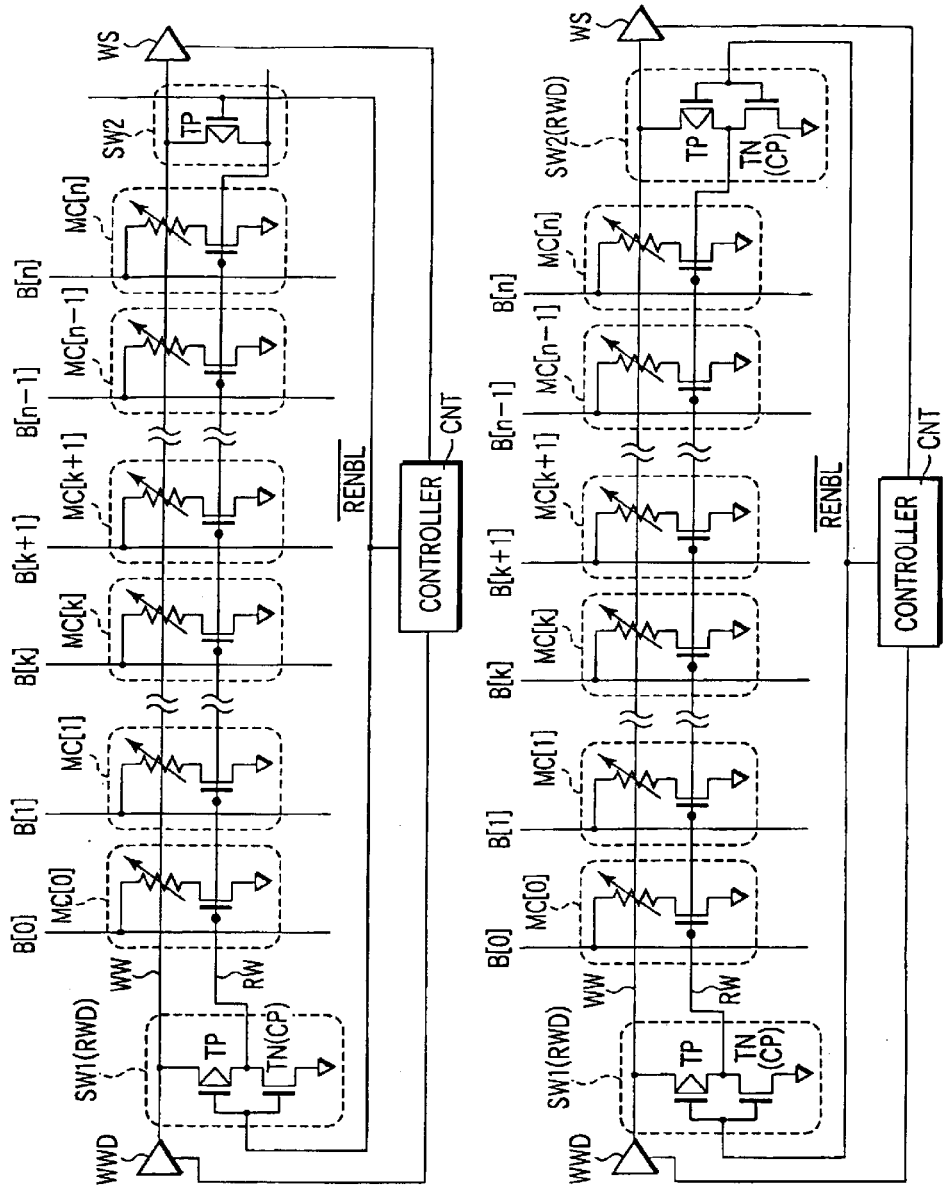
FIG. 9 is a schematic diagram of a magnetic memory device according to a fifth embodiment of the present invention.
FIG. 10 is a schematic diagram of a magnetic memory device according to a sixth embodiment of the present invention.

Embodiments of the present invention will be explained with reference to the accompanying drawings. Like reference numerals are used to designate like structural elements and further explanation will be made if necessary.

(First Embodiment)

FIG. 1 is a schematic diagram of a magnetic memory device according to the first embodiment of the present invention. The memory cells MC[0] to MC[n], bit lines B[0] to B[n], the write word lines WW, and read word lines RW of a circuit shown in FIG. 1 have the same structure as shown in FIG. 21.

Figure 21:
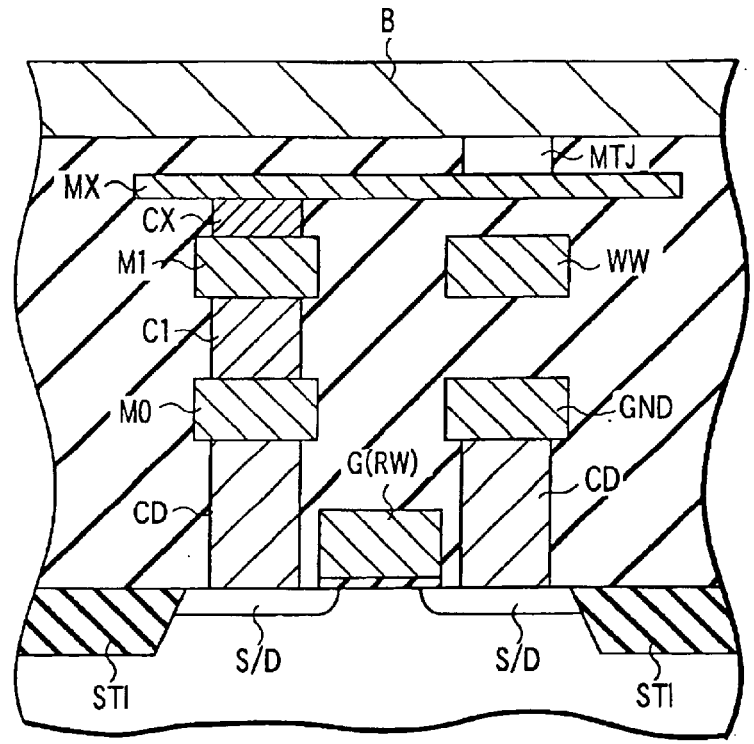
FIG. 21 a schematic view of a typical memory cell of an MRAM.
Figure 22:
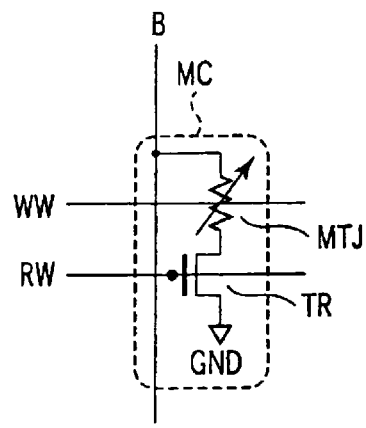
FIG. 22 is a circuit diagram of a memory cell.
Figure 23:
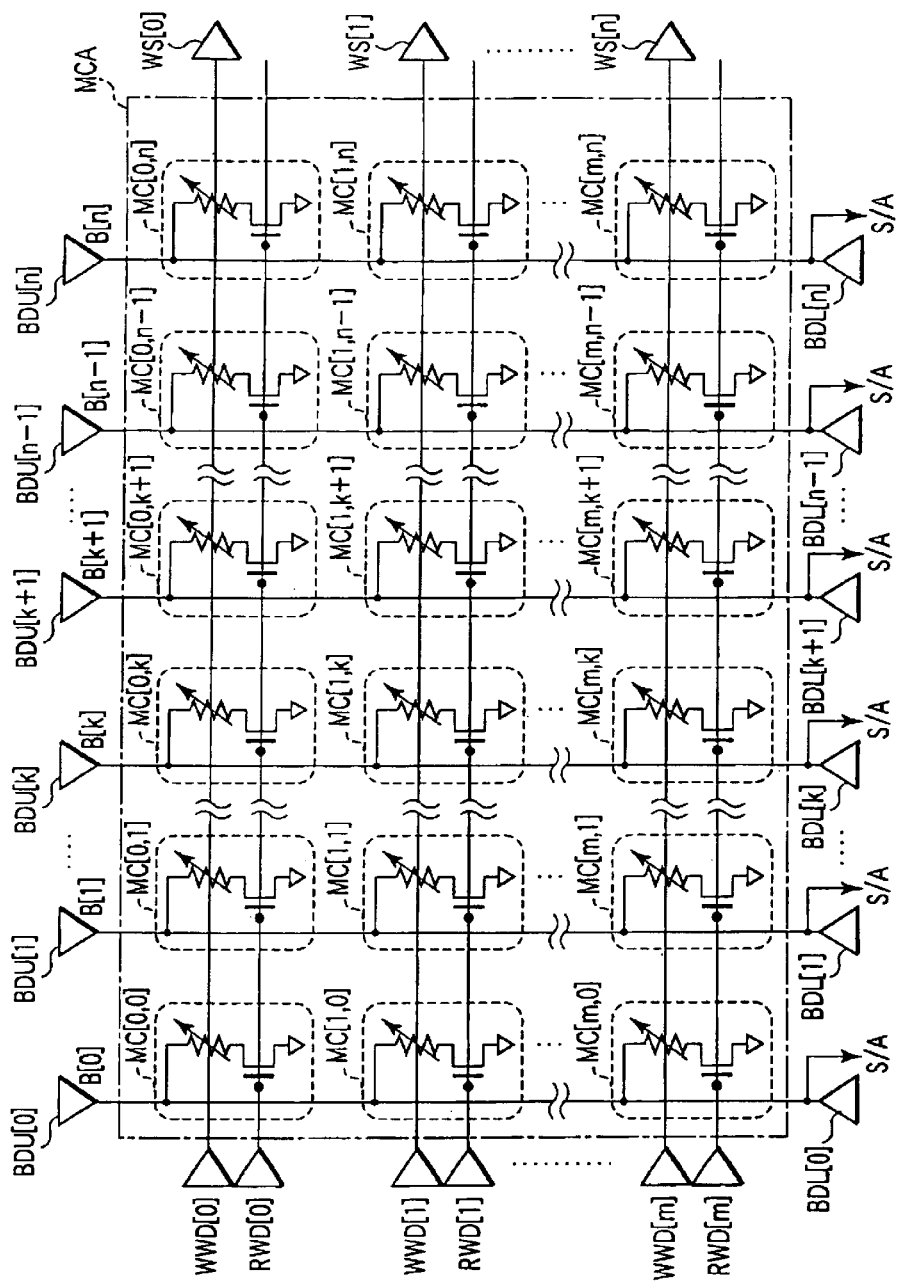
FIG. 23 is a circuit diagram of a memory cell array including the peripheral portion according to a first conventional example.
Figure 24:
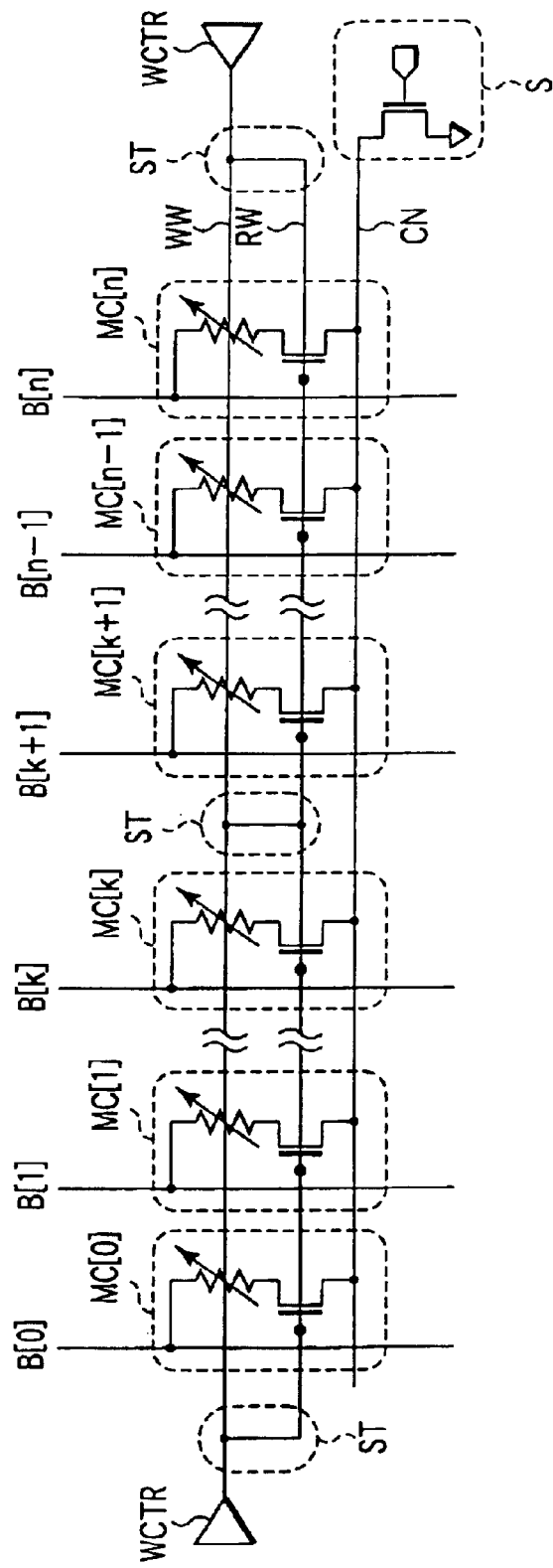
FIG. 24 is a circuit diagram according to a second conventional example.

Referring now to FIGS. 1 and 21, the magnetic memory device according to the first embodiment will be explained. As shown in FIG. 1, memory cells MC[0]-MC[k]-MC[n] are arranged at the intersections between bit lines B[0]-B[k]-B[n] and a write word line WW. Each of the memory cells MC[0] to MC[n] (hereinafter collectively referred to as a "memory cell MC" unless otherwise specified) is formed of an MTJ device MTJ and a memory cell transistor TR. One end of the MTJ device MTJ is connected to the corresponding bit line, B[0] to (B[n] (hereinafter, collectively referred to as "bit line B") and the other end of the MTJ device MTJ is connected to one end of the memory cell transistor TR. The other end of the memory cell transistor TR is connected to the common potential line (e.g., ground).

As shown in FIG. 21, the write word line WW extends so as to intersect with the bit line B (typically at right angles). The MTJ device MTJ is arranged at the intersection between the bit line B and the write word line WW at a distance from the write word line WW. During a write operation, current (hereinafter referred to as "write current") is supplied to the write word line WW to generate a magnetic field. Using the magnetic field generated by the current flowing through the write word line and the magnetic field generated by the current flowing through the bit line B, data is written in the MTJ device MTJ.

To the end of write word line WW at the side near the bit line B[0](hereinafter, the end will be referred to as a "first end of the write word line WW"), a write word line driver WWD is connected. On the other hand, to the end at the side near the bit line B[n] (hereinafter the end will be referred to as a "second end of the write word line WW"), a current sinker WS is connected. During a write operation, current is supplied to the write word line WW by operating the write word line driver WWD and the sinker WS.

The read word line RW is connected to the gate of the memory transistor TR of each memory cell MC. To the end of the read word line RW at the side near the bit line B[0] (hereinafter referred to as "a first end of the read word line RW"), a read word line driver RWD is connected. The read word line driver RWD supplies to the read word line with a voltage to turn on the memory cell transistor TR during a read operation.

A switching circuit SW1 is connected between the first end of the write word line WW and the first end of the read word line RW. Similarly, a switching circuit SW2 is connected between the second end of the write word line WW and the second end of the read word line RW. In other words, switching circuits SW1 and SW2 are arranged outside a set of the memory cells consisting of the memory cells MC[0] to MC[n].

Any device may be used as switching circuits SW1 and SW2 as long as it connects or disconnects both the first ends and the second ends, respectively by the instruction of an electric signal. The turn-on and off of the switching circuits SW1 and SW2 are controlled by a read enable signal RENBL supplied from a control unit CNT. The switching circuits SW1 and SW2 are turned off during a write operation and turned on during a read operation. The control unit CNT controls the operations of the write word line driver WWD, current sinker WS, and read word line driver RWD.

One set of the circuits of the write word line WW, read word line RW, write word line driver WWD, read word line driver RWD, current sinker WS, switching circuits SW1, SW2, and memory cells MC[0] to MC[n] is arranged repeatedly a plurality of times along the bit line B. The same structural feature may be applied to the second embodiment onward.

FIG. 1 shows a memory cell array including memory cells MC[0] to MC[n] and the switching circuits SW1 and SW2 respectively arranged outside of the array. However, the arrangement of the circuit is not limited to this. This embodiment may be applied to the case where a plurality of memory cell arrays are arranged along the write word line WW (or the read word line RW). In this configuration, as shown in FIG. 2, the switching circuit SW2 may accompany every memory cell array MCA[0], MCA[1] . . . MCA[n] each including memory cells MC[0] to MC[n]. Alternatively, as shown in FIG. 3, switching circuits SW1 and SW2 are arranged respectively outside of a set of memory cell arrays MCA[0] MCA[1] . . . MCA[n] at both sides. In other words, the switching circuits SW1 and SW2 may be arranged with respect to every unit composed of the write word line WW and the read word line RW. In this case, a row of memory cell constituted by memory cells MC[0] to MC[n] is arranged repeatedly a plurality of times to form a plurality of memory cell arrays MCA[0] to MCA[n]. The same structural feature of the memory cells MC[0] to MC[n] and the memory cell arrays MCA[0] to MCA[n] will be applied to the second embodiment onward.

Furthermore, both the write word line driver WWD and the read word line driver RWD may be operated during a read operation.

According to the magnetic memory device of the first embodiment, the write word line WW and the read word line RW are connected by the switching circuits SW1 and SW2 arranged outside of memory cells MC[0] to MC[n] at both sides. The read word line RW (high resistance) is connected to the write word line WW (low resistance) by turning on the switching units SW1 and SW2 during a read operation. As a result, the resistance of the read word line RW substantially decreases since it equals to the combined resistance of the read word line RW plus the write word line WW. Therefore, the read operation speed can be increased.

On the other hand, the switching circuits SW1 and SW2 are turned off during a write operation. Write current flows only through the low-resistance word line WW but does not flow through the read word line RW. Therefore, the write operation is performed at as high a speed as conventional. When the write word line driver WWD is not turned on during a read operation, the write current is not supplied to the read word line RW, so that the read word line RW can be prevented from being damaged by the write current. The memory cell transistor TR is not turned on during the write operation, either.

The switching circuits SW1 and SW2 are arranged outside the array of the memory cells MC[0] to [n] and therefore need not be arranged between the memory cells MC[0] to [n], unlike the second conventional circuit design. Therefore, the periodical layout pattern of the memory cell array is not disturbed. In addition, since the space for the shunt ST is not required, it is possible to prevent the area occupied by the memory cell array from increasing. As a result, the degree of integration increases.

(Second Embodiment)

The circuit arrangement according to the second embodiment is substantially the same as in the first embodiment except that switching circuit SW1 is not present.

FIG. 4 is a schematic diagram of a magnetic memory device according to the second embodiment of the present invention. As shown in FIG. 4, the write word line WW and the read word line RW are connected only by the switching circuit SW2.

During a write operation, the switching circuit SW2 is turned off. The write word line driver WWD starts up the driving write word line WW. During a read operation, the write word line driver WWD and the read word line driver RWD are driven while turning on the switching circuit SW2. The memory cell transistors TR of memory cells MC[n], MC[n-1] in the neighborhood of the switching circuit SW2 are turned on by the voltage supplied from the low resistance write word line WW via the switching circuit SW2.

According to the magnetic memory device of the second embodiment, the switching circuit SW2 is arranged between the read word line RW and the write word line WW at the opposite end (second end) to the one at which the read word line driver RWD is placed, with memory cells MC[0] to MC[n] interposed between them. Therefore, during a read operation, the memory cell transistors TR in the neighborhood of the switching circuit SW2 are turned on by the voltage supplied from the write word line WW. In other words, the current path to the gates of the neighboring memory cell transistors TRs of the switching circuit SW2 is constituted by the write word line WW. Therefore, the resistance of this passage is low compared to the case where the current path is constituted by the read word line RW alone. With this constitution, it is possible to reduce the overall time required from the start up of the write word line driver WWD and the read word line driver RWD until all memory cell transistors TRs connected to the common read word line RW are started up. As a result, the speed of the read operation can be increased.

(Third Embodiment)

The circuit arrangement of the third embodiment is substantially the same as in the first embodiment except that an MIS (Metal Insulator Semiconductor) transistor (as is in the third embodiment) is used as the switching circuit SW1 and SW2. In the description below, an MOS (metal oxide semiconductor) transistor is included in the MIS transistor.

FIG. 5 is a schematic diagram of a magnetic memory device according to the third embodiment of the present invention. As shown in FIG. 5, a P-type MIS transistor TP is arranged in the switching circuits SW1 and SW2 of FIG. 1. In other words, an MIS transistor TP is arranged between each of the first ends and the second ends of the write word line WW and the read word line RW. An inverted signal of read enable signal RENBL (hereinafter referred to as a "signal /RENBL") is supplied to the gate of the MIS transistor TP. When the low level signal /RENBL is supplied, the MIP transistor TP is turned on.

Although a p-type MIS transistor is used for the switching circuits SW1 and SW2 in FIG. 5, an N-type MIS transistor may be used as shown in FIG. 6. The N-type MIS transistor TN is connected in the same manner as P-type MIS transistor. When the high level read enable signal RENBL is supplied, the MIS transistor TN is turned on. The N-type MIS transistor TN is operated as same as the P-type MIS transistor.

Furthermore, as shown in FIG. 7, the circuit in which a P-type MIS transistor TP and an N-type MIS transistor TN are arranged in parallel is used for the switching circuits SW1 and SW2. In this case, one end of each of the MIS transistor TP and TN is connected to the write word line WW and the other end of each transistor is connected to the read word line RW. A signal /RENBL is supplied to the gate of the MIS transistor TP, whereas a read enable signal RENBL is supplied to the gate of the MIS transistor TN. When a high level read enable signal RENBL (low level signal /RENBL) is supplied, the MIS transistors TP and TN are turned on. The operation of MIS transistor TN is as same as the p-type MIS transistor TP.

According to the magnetic memory device of the third embodiment, the same effect as in the first embodiment can be obtained.

(Fourth Embodiment)

The circuit arrangement of the fourth embodiment is substantially the same as in the second embodiment except that an MIS transistor is used as the switching circuit SW2.

FIG. 8 is a schematic diagram of a magnetic memory device according a fourth embodiment of the present invention. As shown in FIG. 8, the same type of MIS transistor TP as used in the third embodiment is arranged in the switching circuit SW2. More specifically, an MIS transistor TP is arranged between the second ends of the write word line WW and the read word line RW. A signal /RENBL is supplied to the gate of the MIS transistor TP. Similarly to the third embodiment, an N-type MIS transistor TN and N and P type MIS transistors TN and TP arranged in parallel may be used. The operation is as same as the second embodiment.

According to the magnetic memory device of the fourth embodiment of the present invention, the same effect as that of the second embodiment can be obtained.

(Fifth Embodiment)

The circuit arrangement of the fifth embodiment is substantially the same as in the third embodiment. In addition, the switching circuit SW1 acts as a read word line driver RWD.

FIG. 9 is a schematic diagram of a magnetic memory device according to the fifth embodiment of the present invention. As shown in FIG. 9, the switching circuit SW1 is constituted by a transistor TP in the same as in the third embodiment and acts as a read word line driver RWD. When switching circuit SW1 is used as the read word line driver RWD, the write word line WW acts as a power supply line to the MIS transistor TP.

The switching circuit SW1 (read word line driver RWD) further has a clamping circuit CP for clamping the read word line RW at a predetermined potential. For example, the clamping circuit CP is constituted by an N-type MIS transistor TN. The both ends of the MIS transistor TN is connected to an end of the read word line RW and a common potential line, respectively. A signal /RENBL is supplied to the gate of the MIS transistor TN.

During a write operation, a high-level signal /RENBL is supplied, which turns off the transistor TP and turns on the transistor TN. A write current is supplied through the write word line WW from the write word line driver WWD to the current sinker WS. On the other hand, a common potential is applied to the read word line RW.

During a read operation, a low-level signal /RENBL is supplied, which turns on the transistor TP and turns off the transistor TN. As a result, the read word line RW is driven by a read word line driver RWD. Furthermore, to the memory cell transistor TR in the neighborhood of the switching circuit SW2, a voltage is supplied by way of the write word line WW and the switching circuit SW2.

According to the magnetic memory device of the fifth embodiment, the same effect as in the first embodiment can be obtained. Furthermore, according to the magnetic memory device of the fifth embodiment, the switching circuit SW1 acts as a read word line driver RWD. Therefore, it is not necessary to provide a read word line driver RWD separately. As a result, the circuit arrangement of the magnetic memory device can be simplified and reduced in size.

Furthermore, the switching circuit SW1 (read word line driver RWD) has a clamping circuit CP, which clamps the read word line RW at a predetermined potential (common potential) during operations other than the read operation. As a result, it is possible to prevent the read word line RW from being in a floating state.

(Sixth Embodiment)

The circuit arrangement of the sixth embodiment is substantially the same as in the fifth embodiment except that the switching circuit SW2 acts as a read word line driver RWD.

FIG. 10 shows a schematic diagram of the magnetic memory device according to the sixth embodiment of the present invention.

As shown in FIG. 10, the switching circuit SW2 is constituted by a transistor TP and acts as the read word driver RWD. In the same as in the fifth embodiment, when the switching circuit SW2 acts as the read word line driver RWD, the write word line WW acts as a power supply line to the MIS transistor TP.

The switching section SW2 (read word line driver RWD) has a clamp circuit CP for clamping the read word line RW at a predetermined potential as is the same as in the fifth embodiment. The clamp circuit CP is, for example, constituted by an N-type MIS transistor TN. The two ends of the MIS transistor TN are connected to one end of the read word line RW and the common potential line, respectively. To the gate, a signal /RENBL is supplied.

According to the sixth embodiment of the present invention, the same effect as in the first and fifth embodiments can be obtained. Furthermore, according to the magnetic memory device of the sixth embodiment, the switching circuit SW2 acts as the read word line driver RWD. Therefore, during operation other than the read operation time, the read word line RW can be maintained more accurately at a predetermined potential than in the fifth embodiment.

In FIG. 10, the word line driver WD is connected to one end of the write word line WW and the current sinker WS is connected to the other end. However, the word line driver WD and the current sinker WS may be transposed. This configuration can bring the same effect.

(Seventh Embodiment)

The circuit arrangement of the seventh embodiment is substantially the same as the first embodiment except that the write word line driver WWD and the current sinker WS are transposed.

Figure 11:
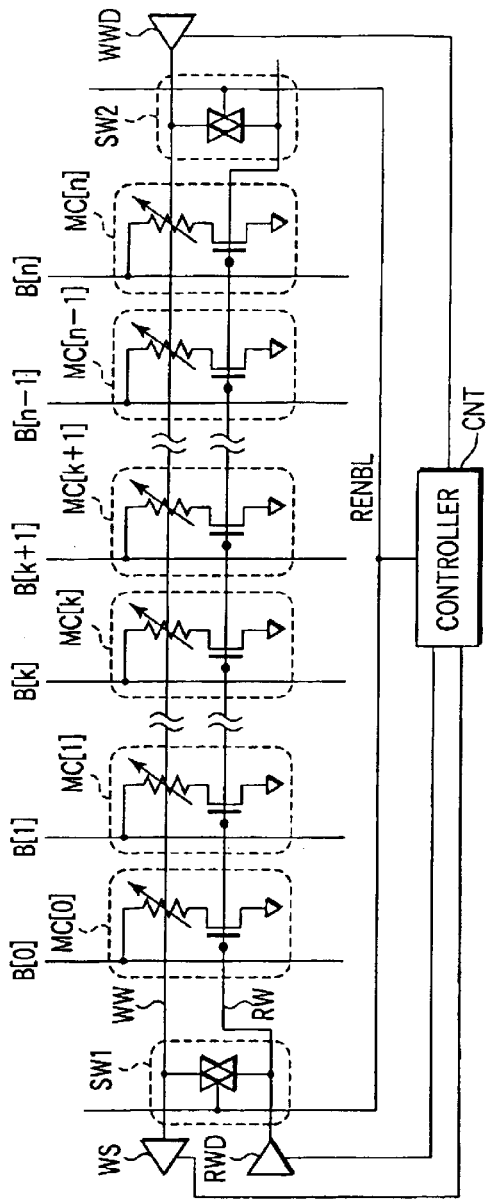
FIG. 11 is a schematic diagram of a magnetic memory device according to a seventh embodiment of the present invention.

FIG. 11 is a schematic circuit arrangement of the magnetic memory device according to the seventh embodiment of the present invention. As shown in FIG. 11, the write word line driver WWD is connected to the second end of the write word line WW. The current sinker WS is connected to the first end of the write word line WW.

During a write operation, the switching circuits SW1 and SW2 are turned off. In this state, current is supplied to the write word line WW by use of the write word line driver WWD and the current sinker WS.

During a read operation, the switching circuits SW1 and SW2 are turned on. In this state, not only the read word line driver RWD but also the write word line driver WWD are operated. To the memory transistor TR in the neighborhood of the read word line driver RWD, a voltage supplied from the read word line driver RWD is applied. On the other hand, to the memory transistor TR in the neighborhood of the switching circuit SW2, a voltage supplied from the write word line driver RWD is applied.

According to the magnetic memory device according to the seventh embodiment, the write word line WW and the read word line RW are connected by the switching circuits SW1 and SW2 arranged outside the array of the memory cells MC[0] to [n]. The write word line driver WWD is connected to the second end of the write word line WW. During a read operation, the read word line driver RWD and the write word line driver RWD are operated. To the memory cell transistor TR in the vicinity of the switching circuit SW2 away from the read word line driver RWD, current is supplied from the write word line driver WWD by way of the switching circuit SW2. Therefore, the flowing distance of current through the high resistant read word line RW toward the memory cell transistor TR is short, thereby increasing the speed of the read operation.

(Eighth Embodiment)

The circuit arrangement of the eighth embodiment is substantially the same as that of the seventh embodiment except that only switching circuit SW 2 is provided similarly to the second embodiment. More specifically, the circuit arrangement of the eighth embodiment is substantially the same as the second embodiment except that the write word line driver WWD and the current sinker WS are transposed.

Figure 12:
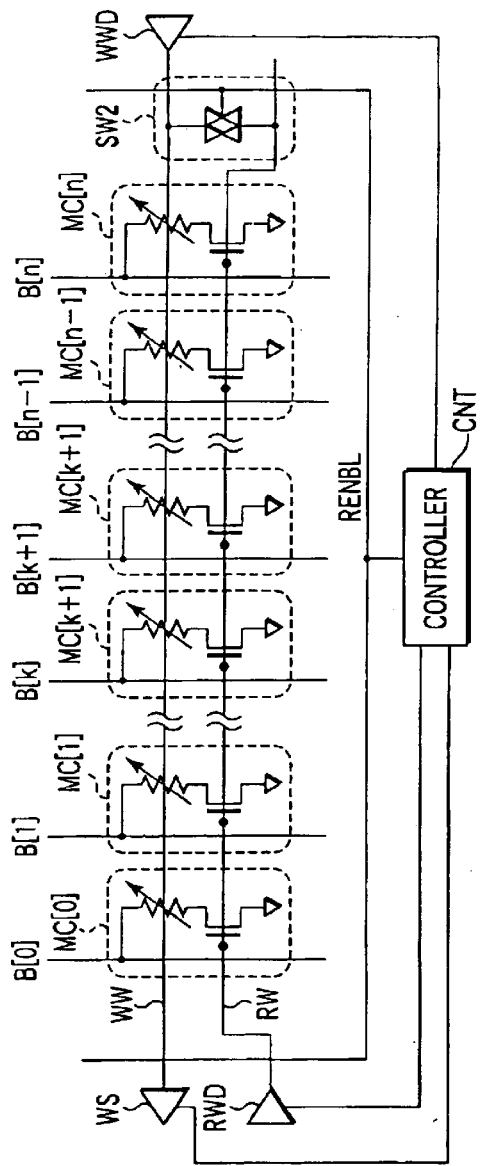
FIG. 12 is a schematic diagram of a magnetic memory device according to an eighth embodiment of the present invention.

FIG. 12 is a schematic circuit arrangement of the magnetic memory device according to the eighth embodiment of the present invention. As shown in FIG. 12, the write word line WW and the read word line RW are connected only by the switching circuit SW2.

During a write operation, the switching circuit SW2 is turned off. In this state, when the write word line driver WWD is operated, a write current is supplied. During a read operation, the switching circuit SW2 is turned on. In this state, when the read word line driver RWD and the write word line driver WWD are operated, a gate voltage of the memory cell transistor TR is supplied.

According to the magnetic memory device of the eighth embodiment, the same effect as in the seventh embodiment can be obtained.

(Ninth Embodiment)

In the ninth embodiment, an MIS transistor is used in the switching circuits SW1 and SW2. More specifically, the circuit arrangement of the ninth embodiment is substantially the same as in the third embodiment except that the write word line driver WWD and the current sinker WS are transposed.

FIG. 13 is a schematic circuit arrangement of the magnetic memory device according to the ninth embodiment.

As shown in FIG. 13, an MIS transistor TP is arranged at the switching circuits SW1 and SW2 in the same manner as in the third embodiment. An N-type MIS transistor TN, and N-type and P-type MIS transistors TN and TP arranged in parallel may be used similarly to the third embodiment. The operation manner is the same as in the seventh embodiment.

According to the ninth embodiment, the same effect as in the seventh embodiment can be obtained.

(Tenth Embodiment)

The circuit arrangement of the tenth embodiment is substantially the same as in the eighth embodiment except that an MIS transistor is used in the switching circuit SW2. More specifically, the circuit arrangement of the tenth embodiment is substantially the same as in the fourth embodiment except that the write word line driver WWD and the current sinker WS are transposed.

FIG. 14 is a schematic circuit arrangement of the magnetic memory device according to the tenth embodiment of the present invention.

As shown in FIG. 14, an MIS transistor TP is arranged in the switching circuit SW2 of FIG. 12 in the same connection manner as in the fourth embodiment. An N-type MIS transistor TN, and N-type and P-type MIS transistors TN and TP arranged in parallel may be used similarly to the third embodiment. The operation manner is the same as in the eighth embodiment.

According to the tenth embodiment, the same effect as in the eighth embodiment can be obtained.

(Eleventh Embodiment)

The circuit arrangement of the eleventh embodiment is substantially the same as that of the ninth embodiment except that the switching circuit SW1 acts as the read word line driver RWD. In other words, the circuit arrangement of the eleventh embodiment is substantially the same as in the fifth embodiment except that the write word line driver WWD and the current sinker WS are transposed.

FIG. 15 is a schematic circuit arrangement of the magnetic memory device according to the eleventh embodiment of the present invention.

As shown in FIG. 15, the switching circuit SW1 is constituted by a transistor TP and acts as the read word line driver RWD, in the same as in the third embodiment. In the same as in the fifth embodiment, the switching circuit SW1 has a clamp circuit CP (read word line driver RWD). According to the magnetic memory device of the eleventh embodiment, the same effect as in the fifth and ninth embodiments can be obtained.

(Twelfth Embodiment)

The circuit arrangement of the twelfth embodiment is substantially the same as in the first embodiment except that the read word line driver RWD is not used.

FIG. 16 is a schematic circuit arrangement of the magnetic memory device according to the twelfth embodiment of the present invention.

As shown in FIG. 16, the read word line driver RWD is not arranged on the read word line RW. The word line driver WD is connected to one end of the write word line WW and the current sinker WS is connected to the other end. The word line driver WD has an ability to supply (drive) write current to the write word line WW and drives both write word line WW and the read word line RW.

During a write operation, the switching circuits SW1 and SW2 are turned off. In this state, when the word line driver WD and the current sinker WS are operated, the write word line WW is driven.

On the other hand, during a read operation, the switching circuits SW1 and SW2 are turned on and the current sinker WS is turned off. In this state, the read word line RW is driven by the word line driver WD.

According to the magnetic memory device of the twelfth embodiment, the write word line WW and the read word line RW are connected by the switching circuits SW 1 and SW2 positioned outside the memory cell MC. Therefore, the same effect as in the first embodiment can be obtained.

Furthermore, according to the magnetic memory device according to the twelfth embodiment, both the write word line WW and the read word line RW are driven by the word line driver WD and the current sinker WS. Therefore, it is not necessary to provide the read word line driver RWD, reducing the layout area for the magnetic memory device.

In FIG. 16, the word line driver WD is connected to one end of the write word line WW and the current sinker WS is connected to the other end. However, the arrangement of the write word line WW and the current sinker WS may be transposed. Also in this case, the same effect can be obtained.

(Thirteenth Embodiment)

The circuit arrangement of the thirteenth embodiment is substantially the same as in the twelfth embodiment except that two word-line drivers are provided.

FIG. 17 is a schematic circuit diagram of the magnetic memory device according to the thirteenth embodiment.

As shown in FIG. 17, word-line drivers WD[0] and WD[1] are connected to one end of the write word line WW.

The word line driver WD[0] has an ability to drive a current (hereinafter referred to as "a current driving ability") larger than the word line driver WD[1]. For example, when a transistor constitutes an output stage of each of the drivers, the relationship may be realized by setting a gate width of the transistor of the word line driver WD[0] larger than that of the word line driver WD[1].

The current driving ability of the word line driver WD[1] is set up sufficiently large to supply a gate voltage of the memory cell transistor TR to the read word line RW. The current driving ability of the word line driver WD[0] is set up large sufficient to supply a write current to the write word line WW, by combining it to the current driving ability of the word line driver WD[1].

During a write operation, the switching circuits SW1 and SW2 are turned off. In this state, when the word line drivers WD[0] and WD[1] and the current sinker WS are operated, the write word line WW is driven.

On the other hand, during a read operation, the switching circuits SW1 and SW2 are turned on and the only the word line driver WD[1] is operated; however, the word line driver WD[0] and the current sinker WS are not operated. As a result, the read word line RW is driven by the word line driver WD[1].

According to the magnetic memory device of the thirteenth embodiment, the same effect as in the twelfth embodiment can be obtained. Furthermore, according to this embodiment, during a write operation, the write word line WW is driven by the two word-line drivers WD[0] and WD[1]. During a read operation, the read word line RW is driven only by the word line driver Wd[1]. Therefore, power consumption can be reduced compared to the case where the write word line WW and the read word line RW are driven by the word line driver having a high current driving ability sufficient to supply the write current.

According to the thirteen embodiment, the current flowing through the write word line WW during a read operation is smaller than that during a write operation. Therefore, it is possible to prevent the current flowing through the write word line WW during a read time from mistakenly writing in the memory cell MC (MTJ device).

In FIG. 17, the word line drivers WD[0] and WD[1] are connected to one end of the write word line WW and the current sinker WS is connected to the other end. However, the write word line drivers WD[0] and WD[1] and the current sinker WS may be transposed. This configuration can also the same effect.

(Fourteenth Embodiment)

The circuit arrangement of the fourteenth embodiment is substantially the same as in the thirteenth embodiment except that the switching circuit SW1 acts as the word line driver RWD as is in the fifth embodiment.

FIG. 18 is a schematic circuit arrangement of the magnetic memory device according to the fourteenth embodiment.

As shown in FIG. 18, a transistor TP is used in the switching circuit SW1 in the same as in the thirteen embodiment. The switching circuit SW1 acts as the read word line driver RWD. Further in the same manner as in the fifth embodiment, the switching circuit SW1 (read word line driver RWD) has a clamp circuit.

During a write operation, a high-level signal /RENBL is supplied, which turns off a transistor TP and turns on the transistor TN. In this state, when word line drivers WD[0] and WD[1] are driven, the write word line WW is driven.

On the other hand, when a low-level signal /RENBL is supplied, which turns on the transistor TP and turns off the transistor TN. In this state, the word line driver WD[1] is operated; however, the word line driver WD[0] and the current sinker WS are not operated. As a result, the read word line RW is driven.

According to the magnetic memory device according to the fourteenth embodiment, the same effect as in the fifth and thirteenth embodiments can be obtained.

(Fifteenth Embodiment)

The circuit arrangement of the fifteenth embodiment is substantially the same as in the fourteenth embodiment except that the switching circuit SW2 acts as the read word line driver RWD as is in the sixth embodiment.

Figures 19, 20:
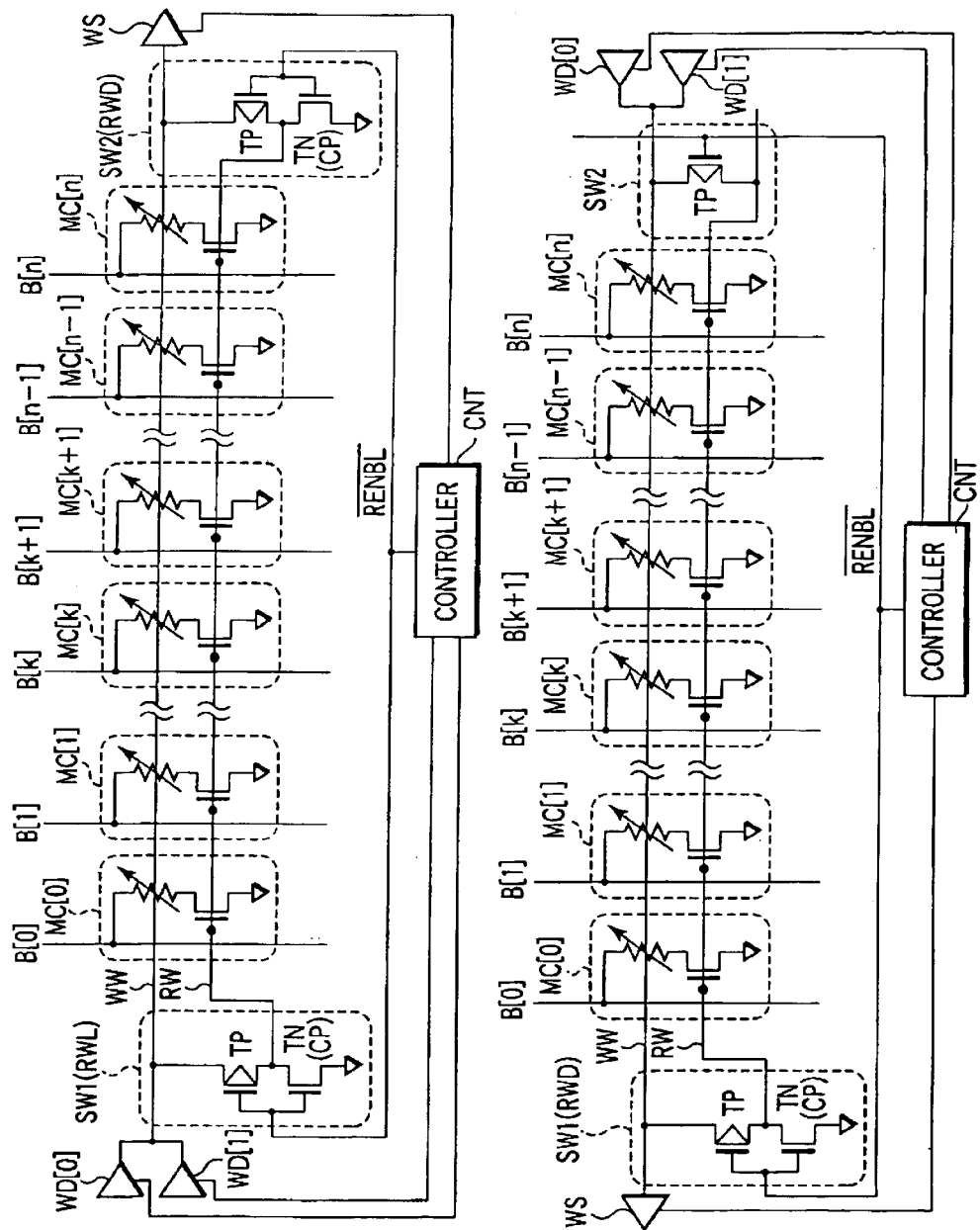
FIG. 19 is a schematic diagram of a magnetic memory device according to a fifteenth embodiment of the present invention.
FIG. 20 is a schematic diagram of a magnetic memory device according to a sixteenth embodiment of the present invention.

FIG. 19 is a schematic circuit arrangement according to the fifteenth embodiment.

As shown in FIG. 19, the switching circuit SW2 is constituted by the transistor TP in the same manner as in the sixth embodiment and acts as the read word line driver RWD. Furthermore, the switching circuit SW2 (read word line driver RWD) has the clamp circuit CP as is in the sixth embodiment.

According to the magnetic memory device according to the fifteenth embodiment, the same effect as in the sixth and fourteenth embodiments can be obtained.

In FIG. 19, the word line drivers WD[0] and WD[1] are connected to one end of the write word line WW and the current sinker WS is connected to the other end. The write word line WW and the current sinker WS may be transposed. This configuration can bring the same effect.

(Sixteenth Embodiment)

In the sixteenth embodiment, the connecting positions of the word line drivers WD[0] and WD[1] and the current sinker WS are transposed as is opposite to the fourteenth embodiment and the same as in the seventh embodiment.

FIG. 20 is a schematic circuit diagram of the magnetic memory device according to the sixteenth embodiment. As shown in FIG. 20, a current sinker WS is connected to one end of the write word line and the word line drivers WD[0] and WD[1] are connected to the other end. The operation is the same as in the fifteenth embodiment.

According to the magnetic memory device of the sixteenth embodiment, the same effect as the seventh and fourteenth embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:

first to n-th MTJ devices recording data;

first to n-th transistors connected to the first to n-th MTJ devices, respectively;

a write word line which generates a magnetic field to be applied to the first to n-th MTJ devices during a write operation;

a read word line which is connected to a gate of each of the first to n-th transistors and which applies a voltage for turning on the first to n-th transistors during a read operation;

a first word line driver which is connected to a first end or a second end of the write word line and which drives the write word line;

a second word line driver which is connected to a first end of the read word line and which drives the read word line; and the first switching circuit which selectively connects a second end of the read word line and the second end of the write word line.

2. The magnetic memory device according to claim 1, wherein the first switching circuit is constituted by a P-type MIS transistor.

3. The device according to claim 1, wherein the first switching circuit is constituted by an N-type MIS transistor.

4. The magnetic memory device according to claim 2, wherein the first switching circuit further comprises an N-type MIS transistor which is connected in parallel to the P-type MIS transistor.

5. The magnetic memory device according to claim 1, further comprising a second switching circuit which selectively connects the first end of the read word line and the first end of the write word line.

6. The magnetic memory device according to claim 5, wherein each of the first and second switching circuits is constituted by a P-type MIS transistor.

7. The magnetic memory device according to claim 5, wherein each of the first and second switching circuits is constituted by an N-type MIS transistor.

8. The magnetic memory device according to claim 6, wherein each of the first and second switching circuits further comprises an N type MIS transistor, which is connected in parallel to the P-type MIS transistor.

9. The magnetic memory device according to claim 6, wherein the second switching circuit acts as the second word line driver to which power is supplied via the write word line.

10. The magnetic memory device according to claim 9, further comprising a first clamp circuit which is connected between the first end of the read word line and a first wiring.

11. The magnetic memory device according to claim 10, wherein the first clamp circuit is constituted by an N-type MIS transistor.

12. The magnetic memory device according to claim 11, wherein the potential of the first wiring is ground potential.

13. The device according to claim 10, further comprising a fourth word line driver which drives the write word line and which is connected in parallel to the first word line driver.

14. The magnetic memory device according to claim 13, wherein the first word line driver has a current driving ability larger than the fourth word line driver.

15. The magnetic memory according to claim 9, wherein the first switching circuit acts as a third word line driver which drives the read word line and to which power is supplied via the write word line.

16. The magnetic memory device according to claim 15, further comprising a second clamp circuit which is connected between the second end of the read line and the first wiring.

17. The magnetic memory device according to claim 16, wherein the second clamp circuit is constituted by an N-type MIS transistor.

18. The magnetic memory device according to claim 15, further comprising a fourth word line driver which drives the write word line and which is connected in parallel to the first word line driver.

19. The magnetic memory device according to claim 18, wherein the first word line driver has a current driving ability larger than the fourth word line driver.

20. The magnetic memory device according to claim 1, further comprising a current sinker which is connected to one of the first end and the second end of the write word line, to which the first word line driver is not connected, and which acts for drawing out the current flowing through the write word line.

21. The magnetic memory device according to claim 1, wherein the write word line intersects successively with the first to n-th MTJ devices from the first end to the second end; and the read word line intersects successively with the gates of the first to n-th transistors from the first end to the second end.

22. The magnetic memory device according to claim 1, wherein the first to n-th MTJ devices form a memory cell row, which is arranged in a single memory cell array.

23. The magnetic memory device according to claim 1, wherein the first to n-th MTJ devices form a memory cell row and the memory cell row is arranged repeatedly a plurality of times to form a plurality of memory cell arrays.

* * * * *